(12) United States Patent
Yoshimura

(10) Patent No.: US 12,184,050 B2
(45) Date of Patent: Dec. 31, 2024

(54) ELECTRICAL JUNCTION BOX

(71) Applicant: Sumitomo Wiring Systems, Ltd., Yokkaichi (JP)

(72) Inventor: Yuya Yoshimura, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 18/264,871

(22) PCT Filed: Jan. 25, 2022

(86) PCT No.: PCT/JP2022/002739
§ 371 (c)(1),
(2) Date: Aug. 9, 2023

(87) PCT Pub. No.: WO2022/172748
PCT Pub. Date: Aug. 18, 2022

(65) Prior Publication Data
US 2024/0088636 A1    Mar. 14, 2024

(30) Foreign Application Priority Data
Feb. 12, 2021   (JP) ................................ 2021-020811

(51) Int. Cl.
*B60R 16/023*    (2006.01)
*H02G 3/03*    (2006.01)
(Continued)

(52) U.S. Cl.
CPC ........... *H02G 3/03* (2013.01); *B60R 16/0239* (2013.01); *H02G 3/081* (2013.01); *H02G 3/16* (2013.01)

(58) Field of Classification Search
CPC .................................................. B60R 16/0239
See application file for complete search history.

(56) References Cited

U.S. PATENT DOCUMENTS

2018/0278034 A1* 9/2018 Chin ....................... H02G 3/03
2018/0310394 A1   10/2018 Kobayashi
(Continued)

FOREIGN PATENT DOCUMENTS

| JP | 2006-087173 A | 3/2006 |
| JP | 2021-087265 A | 6/2021 |

OTHER PUBLICATIONS

International Search Report, Application No. PCT/JP2022/002739, mailed Apr. 19, 2022. ISA/Japan Patent Office.

*Primary Examiner* — Hung V Ngo
(74) *Attorney, Agent, or Firm* — Honigman LLP

(57) ABSTRACT

An electrical junction box includes: a case; a relay; a first heat dissipation member connected to the relay; and a second heat dissipation member connected to the first heat dissipation member. The case includes a first case member, a second case member, a first coupling portion and a second coupling portion coupling the first case member to the second case member. The first case member, the first heat dissipation member, the second heat dissipation member, and the second case member are arranged in a stacked. The first coupling portion and the second coupling portion are arranged at an interval and are orthogonal with respect to the stack, the first heat dissipation member and the second heat dissipation member are interposed therebetween. The first coupling portion is disposed on an outer surface of the case, and the second coupling portion is on an inner surface of the case.

14 Claims, 12 Drawing Sheets

(51) Int. Cl.
*H02G 3/08* (2006.01)
*H02G 3/16* (2006.01)

(56) References Cited

U.S. PATENT DOCUMENTS

| | | | |
|---|---|---|---|
| 2018/0375307 A1* | 12/2018 | Kita | H02G 5/08 |
| 2019/0067925 A1* | 2/2019 | Tsuchida | H02G 3/081 |
| 2019/0297720 A1* | 9/2019 | Fujimura | H05K 1/0204 |
| 2019/0318892 A1 | 10/2019 | Ikejiri et al. | |
| 2022/0015220 A1* | 1/2022 | Fujimura | H02G 5/10 |
| 2022/0189719 A1 | 6/2022 | Isaji et al. | |
| 2022/0248524 A1* | 8/2022 | Igura | H01H 45/12 |
| 2022/0418085 A1* | 12/2022 | Fujimura | H01H 50/047 |

* cited by examiner

ELECTRICAL JUNCTION BOX

CROSS-REFERENCE TO RELATED APPLICATIONS

This application is the U.S. national stage of PCT/JP2022/002739 filed on Jan. 25, 2022, which claims priority of Japanese Patent Application No. JP 2021-020811 filed on Feb. 12, 2021, the contents of which are incorporated herein.

TECHNICAL FIELD

The present disclosure relates to an electrical junction box.

BACKGROUND

For example, in an automobile, in order to supply power from a battery to a plurality of on-board devices, electrical wires from the battery are once connected to an electrical junction box (also referred to as a "junction box"), and the wires are connected to the on-board devices (for example, see JP 2018-93713A).

The electrical junction box described in JP 2018-93713A is to be housed in a battery case, and includes a device cover that includes an upper cover member and a lower cover member, a relay that is housed in the device cover, and a busbar that is connected to terminals of the relay. One end portion of the busbar is connected to the terminals of the relay, the other end portion is connected to a connector terminal that is attached to the device cover, and this connector terminal is connected to other devices, such as a battery, via electrical wires.

The relay generates heat due to a contact point being repeatedly opened and closed. Therefore, with this type of electrical junction box, it is necessary to dissipate heat to the outside of the device cover. In the electrical junction box described in JP 2018-93713A, a heat dissipation sheet is disposed between an intermediate portion that is located between one end portion and the other end portion of the busbar, and between the lower cover member and the battery case, and the busbar, one of the heat dissipation sheets, the lower cover member, and the other of the heat dissipation sheets are stacked in a top-bottom direction. The heat transferred from the terminals of the relay to the busbar is dissipated by being transferred to the battery case via the two heat dissipation sheets and the lower cover member.

With the technique disclosed in Patent Document 1, if air is interposed between the busbar and the heat dissipation sheet, heat cannot be efficiently transferred from the busbar to the heat dissipation sheet. In addition, in recent years, electric vehicles and hybrid vehicles tend to generate more heat from relays. Therefore, there is demand for an electrical junction box with improved heat dissipation.

The present disclosure aims to provide an electrical junction box in which the first heat dissipation member and the second heat dissipation member are reliably brought into close contact with each other, and heat can be efficiently transferred therebetween.

SUMMARY

An electrical junction box according to the present disclosure includes a case, a relay that is attached to the case, a first heat dissipation member that is connected to the relay so as to be able to transfer heat and a second heat dissipation member that is connected to the first heat dissipation member so as to be able to transfer heat. The case includes a first case member, a second case member, and a first coupling portion and a second coupling portion that couple the first case member and the second case member to each other. The first case member, the first heat dissipation member, the second heat dissipation member, and the second case member are stacked in this order in a predetermined first direction. The first coupling portion and the second coupling portion are arranged at an interval in a second direction that is orthogonal to the first direction, with the first heat dissipation member and the second heat dissipation member being interposed therebetween. The first coupling portion is provided on an outer peripheral portion of the case, and the second coupling portion is provided inward of the outer peripheral portion of the case.

Advantageous Effects

With the electrical junction box according to the present disclosure, it is possible to efficiently dissipate the heat of the relay without increasing the size and complexity of the busbar.

DETAILED DESCRIPTION OF PREFERRED EMBODIMENTS

Figure 1:
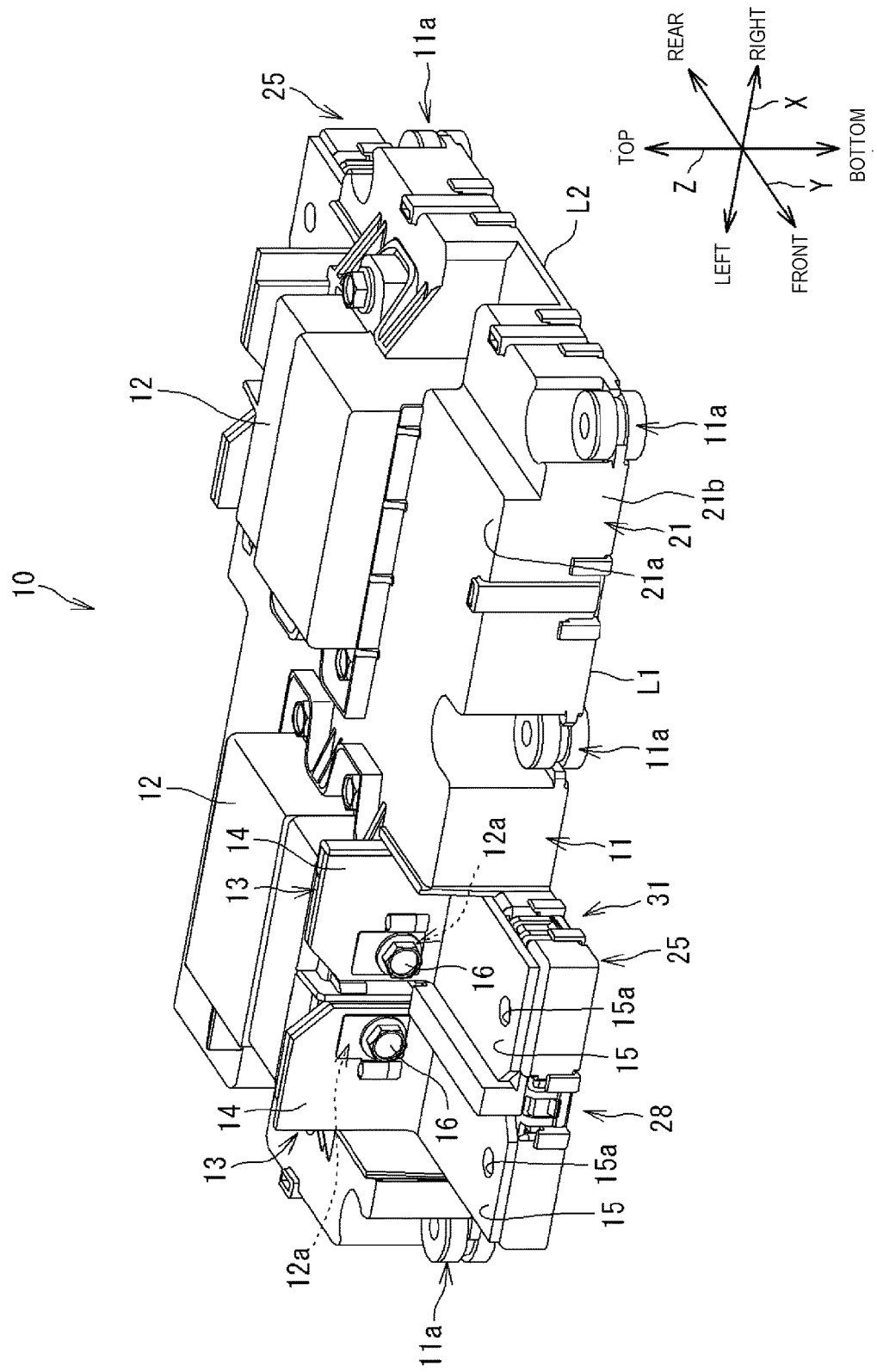
FIG. 1 is a perspective view showing an electrical junction box according to an embodiment.

In summary, an embodiment of the present disclosure includes at least the following.

An electrical junction box according to the present disclosure includes a case, a relay that is attached to the case, a first heat dissipation member that is connected to the relay so as to be able to transfer heat and a second heat dissipation member that is connected to the first heat dissipation member so as to be able to transfer heat. The case includes a first case member, a second case member, and a first coupling portion and a second coupling portion that couple the first case member and the second case member to each other. The first case member, the first heat dissipation member, the second heat dissipation member, and the second case member are stacked in this order in a predetermined first direction. The first coupling portion and the second coupling portion are arranged at an interval in a second direction that is orthogonal to the first direction, with the first heat dissipation member and the second heat dissipation member being interposed therebetween. The first coupling portion is provided on an outer peripheral portion of the case, and the second coupling portion is provided inward of the outer peripheral portion of the case.

In the electrical junction box with the above-described configuration, heat generated in the relay can be transferred to the second case member via the first heat dissipation member and the second heat dissipation member, and dissipated from the second case member to the outside.

The first coupling portion and the second coupling portion of the case are arranged at an interval in the second direction, with the first heat dissipation member and the second heat dissipation member being interposed therebetween. Therefore, the first case member and the second case member can be coupled to each other on both sides of the first heat dissipation member and the second heat dissipation member in the second direction, and the first heat dissipation member and the second heat dissipation member can be sandwiched by the first case member and the second case member so as to be brought into close contact. Therefore, heat generated in the relay can be efficiently transferred from the first heat dissipation member to the second heat dissipation member.

It is preferable that the first heat dissipation member is made of metal and the second heat dissipation member is made of a synthetic resin.

With this configuration, the second heat dissipation member that is made of a synthetic resin is compressed by the first layer portion of the first heat dissipation member that is made of metal, and thus the first layer portion and the second heat dissipation member can be strongly brought into close contact.

Note that the heat dissipation member may be a member that is dedicated to heat dissipation, or a busbar that is connected to the relay.

It is preferable that the case is provided with a protruding portion that protrudes in the second direction, the first heat dissipation member and the second heat dissipation member are provided on the protruding portion, the first coupling portion is provided at a leading end of the protruding portion in the second direction, and the second coupling portion is provided on the opposite side of the leading end of the protruding portion in the second direction with respect to the first heat dissipation member and the second heat dissipation member.

It is preferable that the case is further provided with a third coupling portion and a fourth coupling portion that couple the first case member and the second case member to each other, at two ends of the protruding portion in a third direction that is orthogonal to the first direction and the second direction.

With this configuration, the first case member and the second case member are coupled to each other via not only the first coupling portion and the second coupling portion, but also the third coupling portion and the fourth coupling portion, at positions around the first heat dissipation member and the second heat dissipation member. Therefore, the first heat dissipation member and the second heat dissipation member can be more reliably brought into close contact.

It is preferable that the second coupling portion includes an engagement portion that is provided on the first case member and an engagement-target portion that is provided on the second case member and engages with the engagement portion in the first direction, and at least either one of the engagement portion and the engagement-target portion is provided with an inclined engagement surface that is configured to bring the other of the engagement portion and the engagement-target portion closer to the one of the engagement portion and the engagement-target portion in a direction orthogonal to the first direction when the first case member and the second case member, with the engagement portion and the engagement-target portion engaging with each other, are separated from each other.

With this configuration, when the first case member and the second case member are about to separate from each other, the engagement portion and the engagement-target portion more firmly engage with each other and prevent the first case member and the second case member from becoming detached from each other.

It is preferable that the second coupling portion includes an engagement portion that is provided on the first case member; and an engagement-target portion that is provided on the second case member and with which the engagement portion engages, the second case member is provided with an opening that passes therethrough in the first direction at a position near the engagement-target portion, and the second case member is provided with a wall that is located between the opening and the first heat dissipation member and protrudes toward the first case member.

With this configuration, the wall can separate the first heat dissipation member and the second heat dissipation member from each other, and when the first heat dissipation member is constituted by a conductive member made of metal or the like, the insulating distance between the first heat dissipation member and members to which the second case member is to be attached (e.g. the vehicle body, the battery case, etc.) can be secured and insulation can be improved.

Details of Embodiment of Present Disclosure

Figure 2:
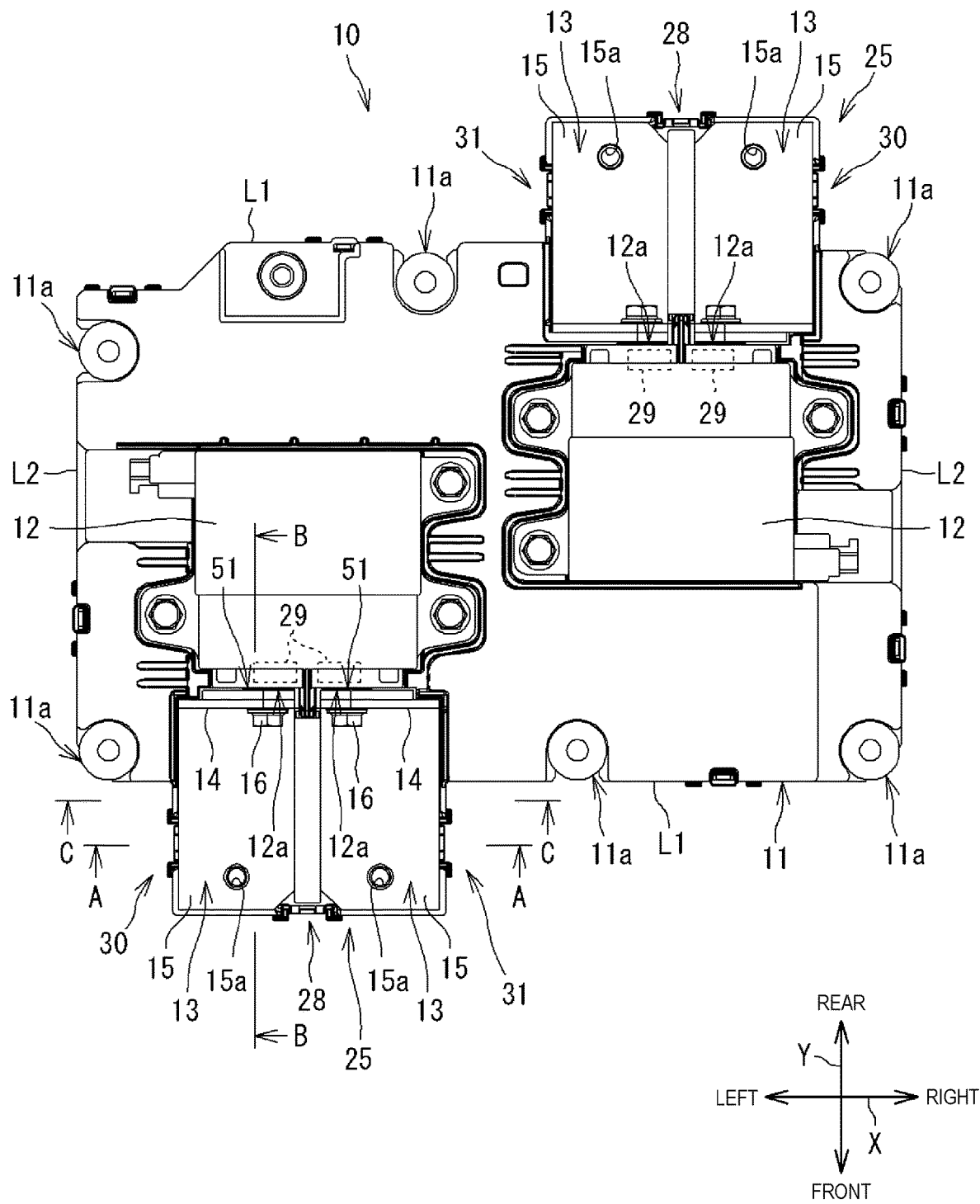
FIG. 2 is a plan view showing the electrical junction box according to the embodiment.

Hereinafter, details of an embodiment of the present disclosure will be described with reference to the drawings.
Overall Structure of Electrical Junction Box FIG. 1 is a perspective view showing an electrical junction box according to the embodiment. FIG. 2 is a plan view showing the electrical junction box according to the embodiment. In the following description, the denotations "top", "bottom", "front", "rear", "left", and "right" correspond to the arrows shown in the drawings. For example, in FIG. 1, the direction indicated by an arrow X (a third direction) is defined as a left-right direction, the direction indicated by an arrow Y (a second direction) is defined as a front-rear direction, and the direction indicated by an arrow Z (a first direction) is defined as a top-bottom direction, where the arrows X, Y, and Z are orthogonal to each other. However, these denotations are only examples, and the direction X may be read as a front-rear direction or a top-bottom direction, the direction Y may be read as a left-right direction or a top-bottom direction, and the direction Z may be read as a front-rear direction or a left-right direction, for example.

An electrical junction box 10 is a component that is connected between a battery of an automobile and a plurality of on-board devices. The electrical junction box 10 may also be referred to as a junction box (JB). The electrical junction box 10 includes a case 11, relays 12, and busbars 13.

The case 11 has an uneven upper surface, but, as a whole, the case 11 is formed in a box shape that is flattened in the top-bottom direction Z. In a plan view, the case 11 has a substantially rectangular shape. In the present embodiment, long sides L1 of the case 11 are arranged in the left-right direction X, and short sides L2 thereof are arranged in the front-rear direction. The front surface and the rear surface of the case 11 are each provided with a protruding portion 25 extending in the front-rear direction Y. The four corners and respective intermediate portions of the long sides L1 of the case 11 are each provided with a boss portion 11a. The boss portions 11a are used to attach the case 11 to an attachment-target member 100 (see FIG. 7) such as a vehicle chassis or a battery box with fastening members such as bolts.

Each relay 12 is a component that is electrically connected between the battery and the on-board devices, and controls ON and OFF of electrical signals from the battery to the on-board devices. Each relay 12 is a mechanical relay, for example, and houses a coil, a spring, and the like. Each relay 12 is attached to the upper surface of the case 11, and the upper portion thereof is exposed to the outside. In the present embodiment, two relays 12 are attached to the case 11 as shown in FIG. 2. Specifically, two relays 12 are arranged side by side in the left-right direction X. The relay 12 on the left side has two terminals 12a on the front end surface thereof. The relay 12 on the right side has two terminals 12a on the rear end surface thereof. On each relay 12, the two terminals 12a are arranged side by side in the left-right direction X. The number of relays 12 attached to the case 11 is not specifically limited, and may be one or three or more.

The relays 12 according to the present embodiment are high-voltage relays that can operate at a voltage (for example, 30 V or higher) higher than a normal voltage (for example, 12 V, 24 V, etc.). The relays 12 tend to become hot due to the application of a high voltage. Therefore, the electrical junction box 10 is provided with a heat dissipation structure 50, which will be described below.

Figure 3:
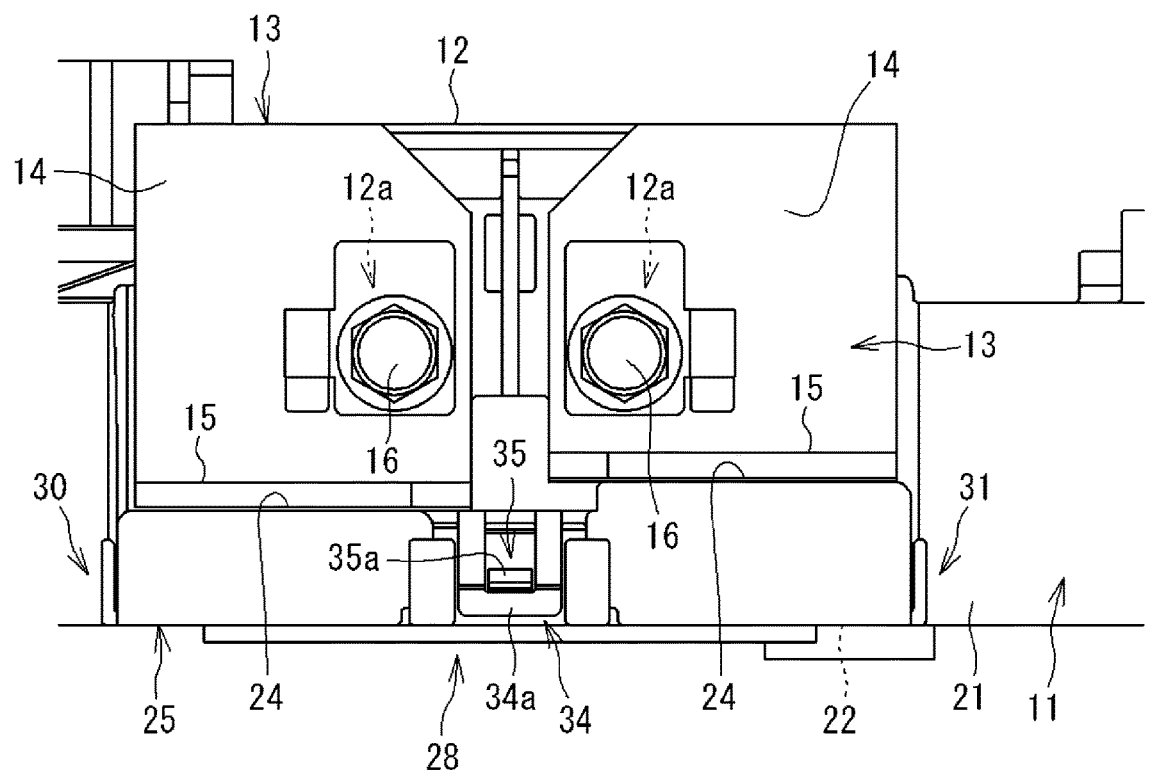
FIG. 3 is a front view showing a relay and busbars of the electrical junction box.
Figure 3:
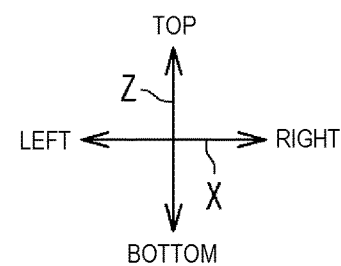

FIG. 3 is a front view showing a relay and busbars of the electrical junction box. In particular, FIG. 3 shows the relay 12 and the busbars 13 on the left side in FIG. 2.

As shown in FIGS. 1 to 3, each busbar 13 is a conductive member with one end portion 14 electrically connected to the relay 12 and the other end portion 15 electrically connected to other devices such as on-board devices or the battery. Each busbar 13 is made of metal such as copper, a copper alloy, aluminum, or an aluminum alloy, for example. When the relay 12 is turned on, a current flows through the busbars 13.

One busbar 13 is attached to each of the two terminals 12a of the relay 12. Each busbar 13 is formed by bending a single strip into an L-shape. Each busbar 13 includes a first piece 14 and a second piece 15 that are orthogonal to each other. The first pieces 14 are connected to the relay 12, and the second pieces 15 are connected to other devices. Each first piece 14 is provided with a connection hole 14a (see FIG. 8) to be connected to the relay 12. Each second piece 15 is provided with a connection hole 15a to which an electrical wire for another device is to be connected.

Figure 8:
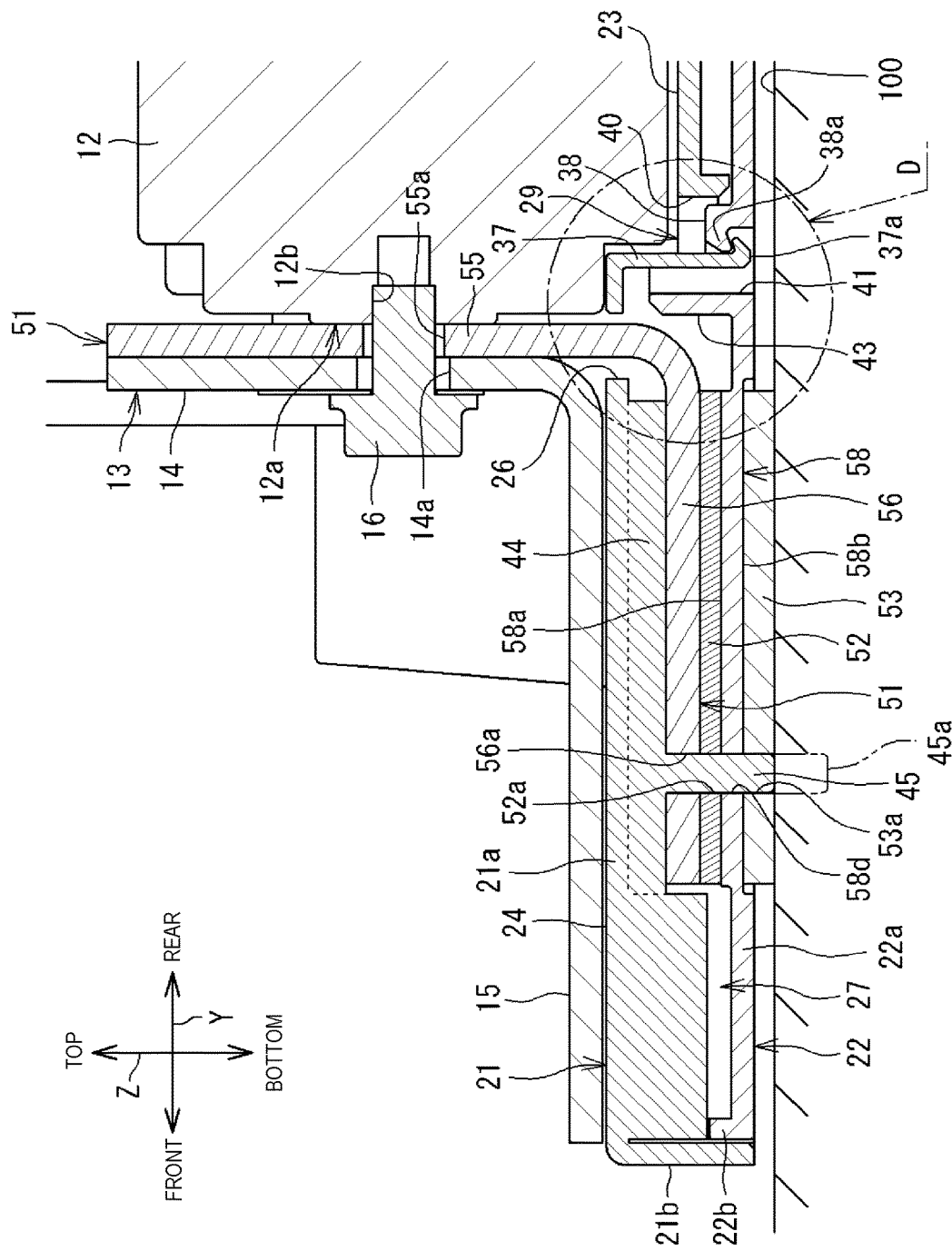
FIG. 8 is a cross-sectional view taken along a line B-B in FIG. 2.

FIG. 8 is a cross-sectional view taken along a line B-B in FIG. 2.

One end portion (the first piece 14) of each busbar 13 is attached to a terminal 12a of the relay 12 via a connection member 16. The connection member 16 according to the present embodiment is a screw. The connection member 16 is inserted into the connection hole 14a in the first piece 14 of the busbar 13, and is attached to a female threaded hole 12b provided in the terminal 12a of the relay 12. The connection member 16 is also used to attach a heat dissipation plate (first heat dissipation member) 51, which will be described later, to the terminal 12a of the relay 12. That is to say, the connection member 16 fixes both the busbar 13 and the heat dissipation plate 51 to the terminal 12a of the relay 12.

As shown in FIG. 3, the respective second pieces 15 of the busbars 13 arranged side by side in the left-right direction are at different heights in the top-bottom direction Z. Specifically, the second piece 15 of the right busbar 13 is located at a higher position than the second piece 15 of the left busbar 13.

Structure of Case

Figure 4:
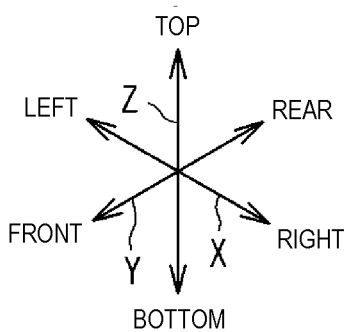
FIG. 4 is a perspective view showing a portion of a lower case member of a case seen diagonally from above.
Figure 4:
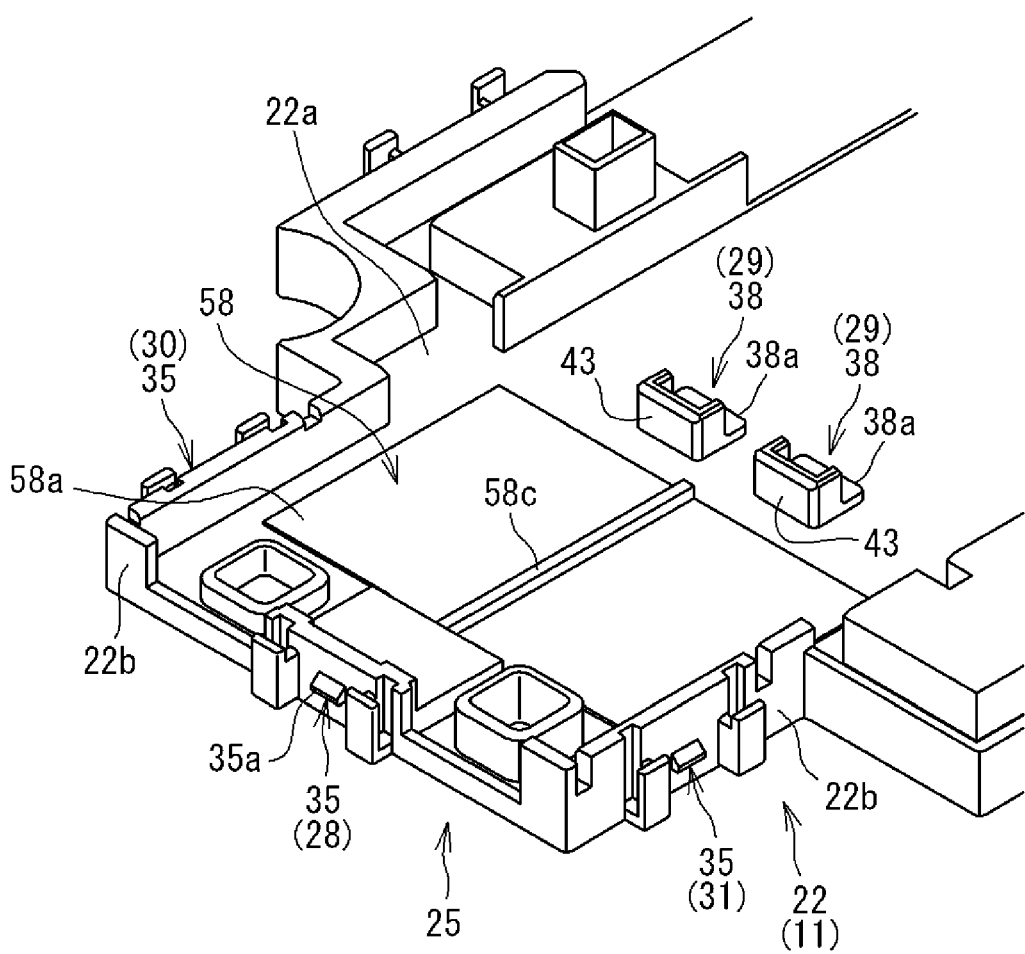
Figure 5:
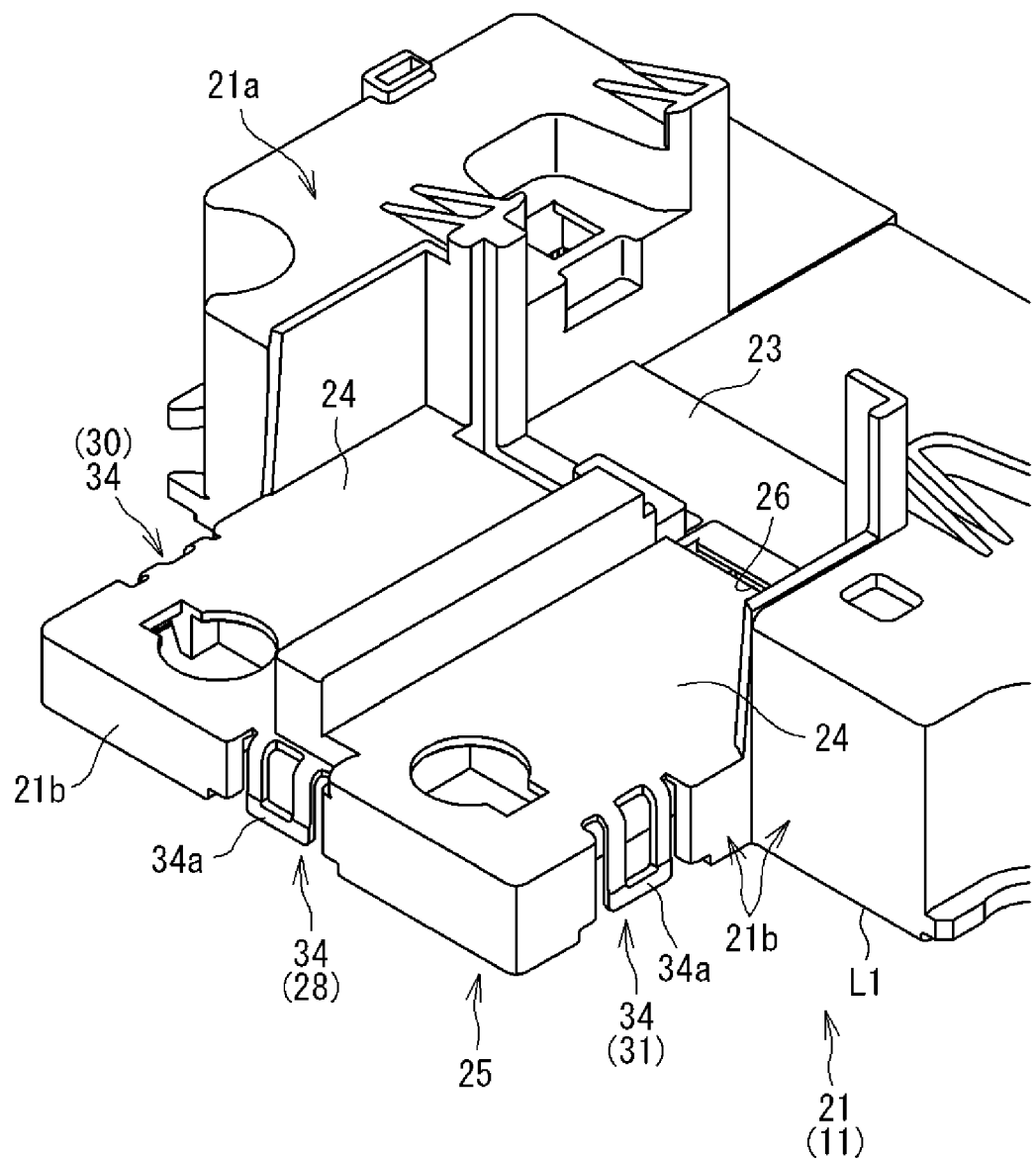
FIG. 5 is a perspective view showing a portion of an upper case member of the case seen diagonally from above.
Figure 6:
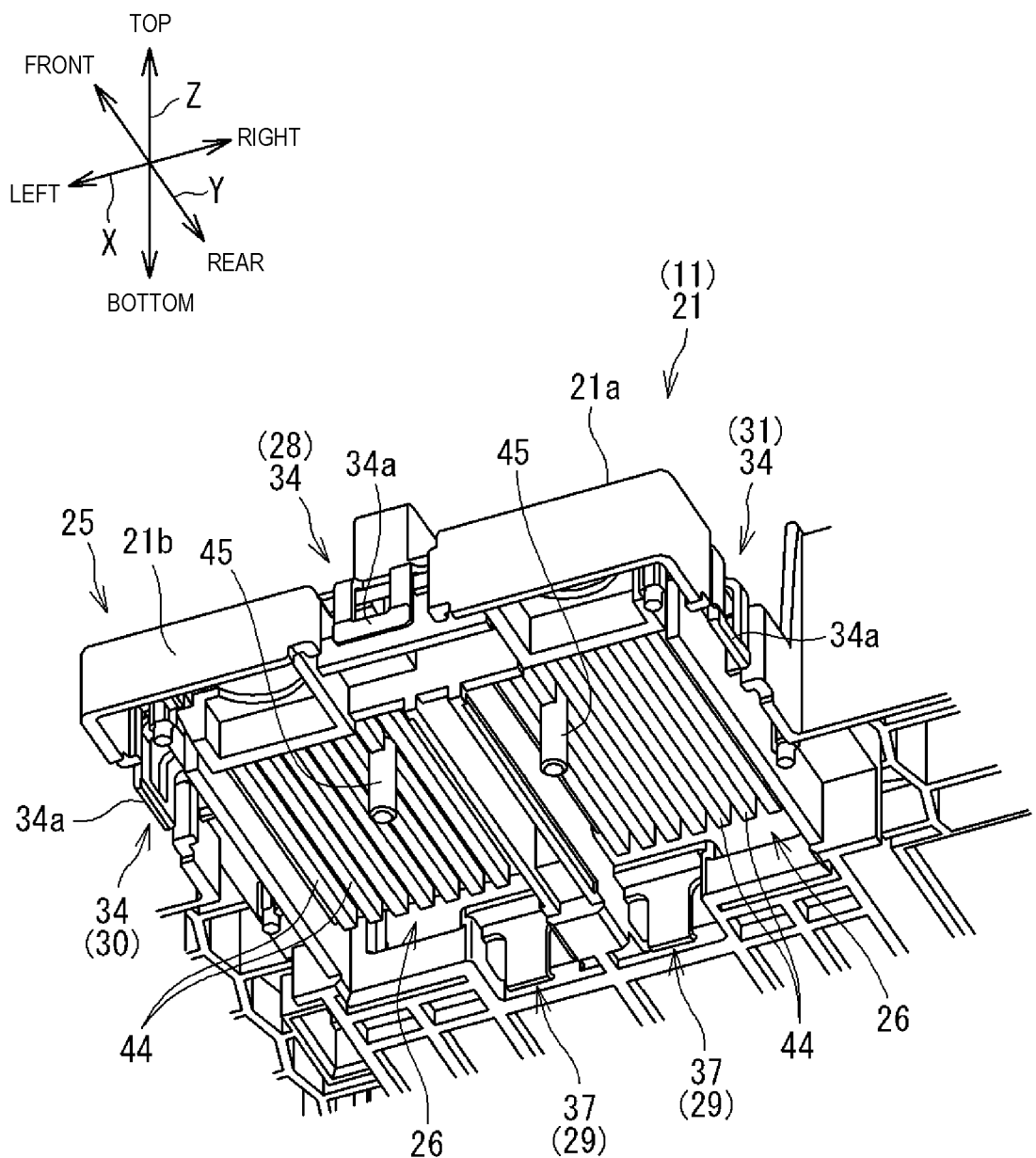
FIG. 6 is a perspective view showing a portion of the upper case member of the case seen diagonally from below.

FIG. 4 is a perspective view showing a portion of a lower case member of the case seen diagonally from above. FIG. 5 is a perspective view showing a portion of an upper case member of the case seen diagonally from above. FIG. 6 is a perspective view showing a portion of the upper case member of the case seen diagonally from below. FIGS. 4 to 6 show the shape of the case 11 around the left relay 12 and busbars 13 in FIG. 2. Hereinafter, the structure of the case 11 in the vicinity of the relays 12 and the busbar 13 will be described.

The case 11 is made of an insulating material, which is, for example, a synthetic resin material such as polypropylene containing glass fiber or talc. The case 11 includes an upper case member (first case member) 21 and a lower case member (second case member) 22.

As shown in FIG. 5, the upper case member 21 includes a top plate 21a and an outer peripheral wall 21b provided along the outer periphery of the top plate 21a. A relay base 23 and busbar bases 24 are formed on the upper surface of the top plate 21a. The relay 12 is fixed to the relay base 23 in the state of being mounted thereon. The second pieces 15 of busbars 13 are placed on the busbar bases 24 (see FIG. 3). The first piece 14 of the busbar 13 is connected to the terminal 12a of the relay 12 fixed to the relay base 23. The upper surface of the protruding portion 25 of the case 11 is used as the busbar bases 24.

As shown in FIG. 6, the lower surface of the top plate 21a of the upper case member 21 is provided with a plurality of ridges 44 and positioning protrusions (positioning portions) 45. The plurality of ridges 44 extend in the front-rear direction Y, and are arranged one after another in the left-right direction X. The plurality of ridges 44 function as ribs for increasing the rigidity of the upper case member 21 against bending deformation.

The positioning protrusions 45 extend downward from the lower surface of the top plate 21a. Each positioning protrusion 45 is formed into a cylindrical shape. The positioning protrusions 45 are used to position a plurality of members that constitute the heat dissipation structure 50 described below, relative to the case 11. Specific effects of the ridges 44 and the positioning protrusions 45 will be described below.

As shown in FIG. 4, the lower case member 22 includes a bottom plate 22a and an outer peripheral wall 22b provided along the outer periphery of the bottom plate 22a. The bottom plate 22a is provided with a sheet base 58. In a plan view, the sheet base 58 is formed in a rectangular shape. As shown in FIG. 8, the bottom plate 22a of the lower case member 22 is formed so that the sheet base 58 is slightly shifted upward. Therefore, an upper surface 58a of the sheet base 58 protrudes upward relative to the upper surface of the bottom plate 22a therearound. A lower surface 58b of the sheet base 58 is recessed upward relative to the lower surface of the bottom plate 22a therearound.

An upper heat dissipation sheet (second heat dissipation member) 52 of the heat dissipation structure 50 described below is placed on the upper surface 58a of the sheet base 58. A lower heat dissipation sheet (third heat dissipation member) 53 of the heat dissipation structure 50 is placed on the lower surface 58b of the sheet base 58. A central portion of the upper surface 58a of the sheet base 58 in the left-right direction X is provided with a ridge 58c that extends in the front-rear direction Y.

As shown in FIG. 2, the case 11 is provided with a plurality of coupling portions 28 to 31 that couple the upper case member 21 and the lower case member 22 to each other. Hereinafter, the first to fourth coupling portions 28 to 31 in the vicinity of the two busbars 13 connected to the left relay 12 will be described.

The first coupling portion 28 couples the upper case member 21 and the lower case member 22 to each other at a leading end of the protruding portion 25 of the case 11. The second coupling portions 29 couple the upper case member 21 and the lower case member 22 to each other at positions spaced from the first coupling portion 28 in the front-rear direction Y. The second coupling portions 29 are provided inside the outer periphery of the case 11. The third coupling portion and the fourth coupling portion 31 couple the upper case member 21 and the lower case member 22 on the two sides of the protruding portion 25 in the left-right direction X, respectively.

The first coupling portion 28, the third coupling portion 30, and the fourth coupling portion 31 have the same configuration except the orientations thereof. Therefore, the configuration of the first coupling portion 28 will be described below as a representative.

As shown in FIG. 3, the first coupling portion 28 includes an engagement portion 34 provided on the upper case member 21 and an engagement-target portion 35 provided on the lower case member 22.

As also shown in FIGS. 5 and 6, the engagement portion 34 is formed in a substantially U-shape in a front view. The engagement portion 34 is provided with a claw receiving portion 34a that extends in the left-right direction X at the lower end thereof.

As also shown in FIG. 4, the engagement-target portion 35 is provided with a claw portion 35a that protrudes outward from the outer peripheral wall 22b of the lower case member 22. The claw portion 35a engages with the claw receiving portion 34a from above. As a result of this engagement, the upper case member 21 and the lower case member 22 are coupled to each other so as not to become separate in the top-bottom direction Z.

The third coupling portion 30 is provided on the left side surface of the protruding portion 25, and has the configuration of the first coupling portion 28 rotated by 90° to the left. The fourth coupling portion 31 is provided on the right side surface of the protruding portion 25, and has the configuration of the first coupling portion 28 rotated by 90° to the right.

As shown in FIG. 2, the second coupling portions 29 are respectively provided at two positions side by side in the left-right direction so as to correspond to the two busbars 13. As shown in FIG. 8, each second coupling portion 29 includes an engagement portion 37 provided on the upper case member 21 and an engagement-target portion 38 provided on the lower case member 22. As also shown in FIG. 6, the engagement portion 37 protrudes downward from the lower surface of the top plate 21a of the upper case member 21. The engagement portion 37 has a plate shape and is orthogonal to the front-rear direction Y. As also shown in FIG. 4, the engagement-target portion 38 protrudes upward from the bottom plate 22a of the lower case member 22.

Figure 12:
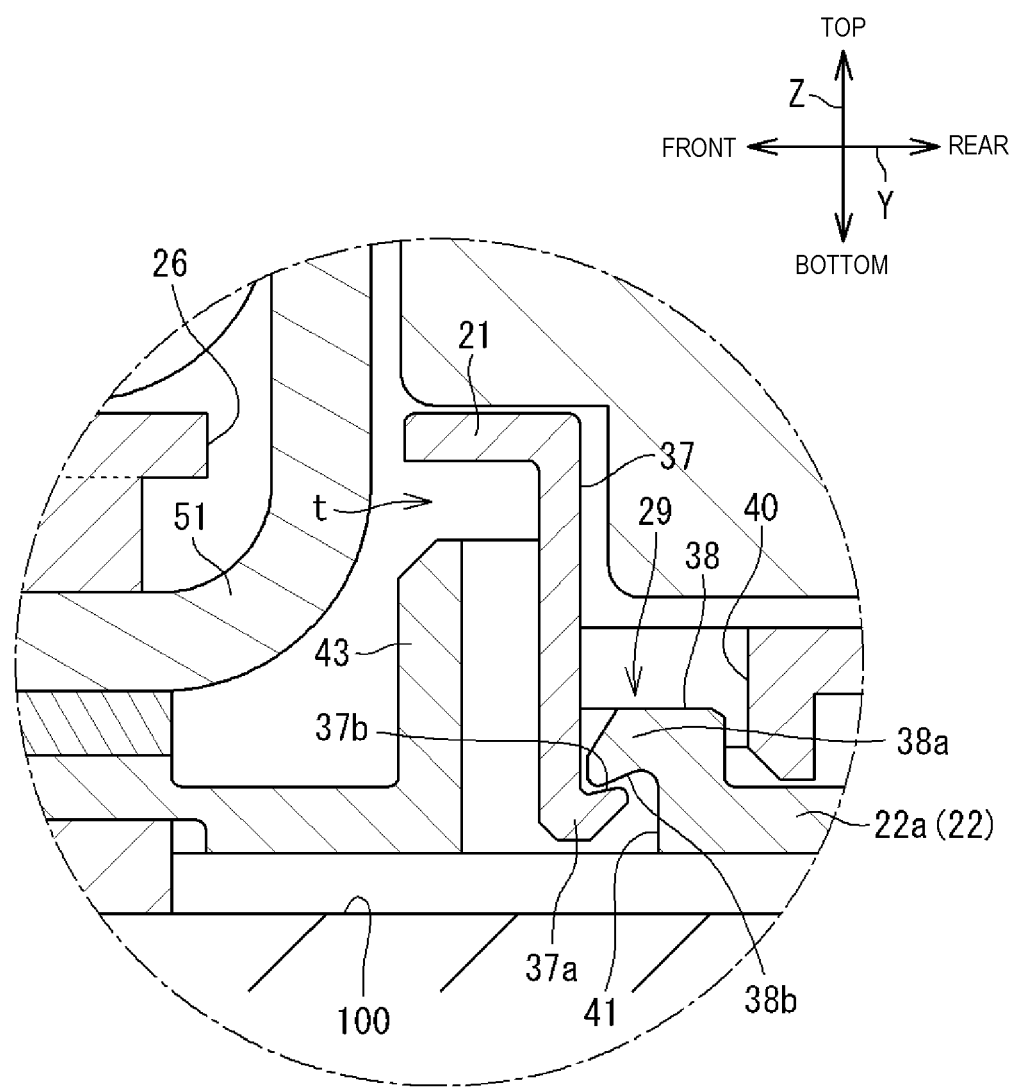
FIG. 12 is an enlarged view of a portion D in FIG. 8.

FIG. 12 is an enlarged view of a portion D in FIG. 8.

A hook portion 37a that is bent rearward is formed at the lower end of the engagement portion 37. A hook portion 38a that is bent forward is formed at the upper end of the engagement-target portion 38. The hook portion 37a of the engagement portion 37 engages with the hook portion 38a of the engagement-target portion 38 in the top-bottom direction Z. The engagement portion 37 is inserted into an opening 41 formed in the bottom plate 22a of the lower case member 22. The engagement-target portion 38 is inserted into an opening 40 formed in the upper case member 21. The engagement portion 37 is formed at the front edge of the opening 40, and the engagement-target portion 38 is formed at the rear edge of the opening 41.

An upper surface 37b of the hook portion 37a of the engagement portion 37 and a lower surface 38b of the hook portion 38a of the engagement-target portion 38 each constitute an engagement surface. The engagement surfaces 37b and 38b are in contact with each other in the top-bottom direction. The engagement surfaces 37b and 38b are inclined downward in the forward direction. Therefore, for example, in a state where the engagement portion 37 and the engagement-target portion 38 engage with each other, if a force is applied to the upper case member 21 and the lower case member 22 to separate them from each other, the engagement portion 37 and the engagement-target portion 38 are attracted to each other in the front-rear direction due to the inclination of the engagement surfaces 37b and 38b. Therefore, the engagement portion 37 and the engagement-target portion 38 more firmly engage with each other, and the coupling of the upper case member 21 and the lower case member 22 is maintained.

Configuration of Heat Dissipation Structure

Figure 7:
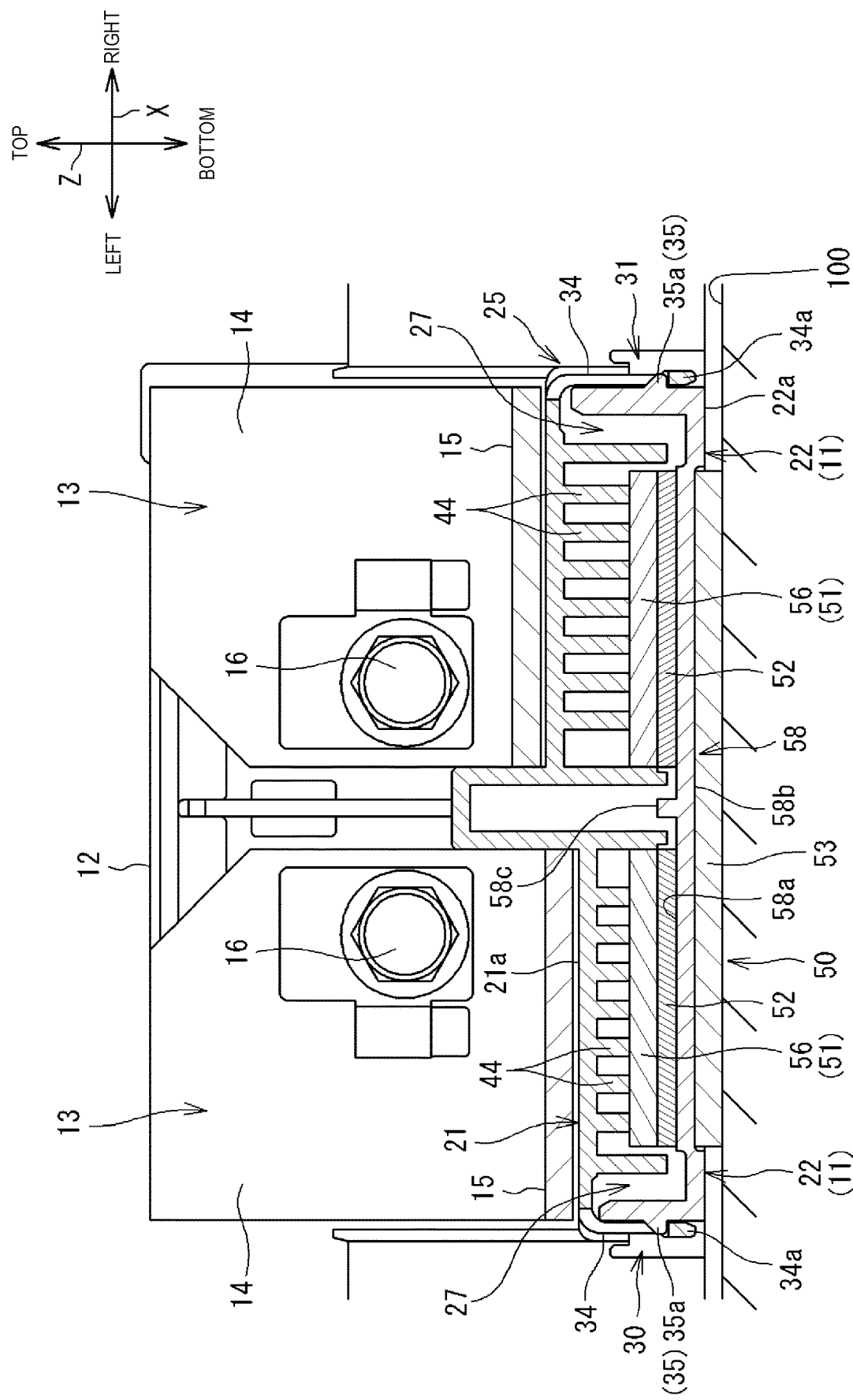
FIG. 7 is a cross-sectional view taken along a line A-A in FIG. 2.
Figure 9:
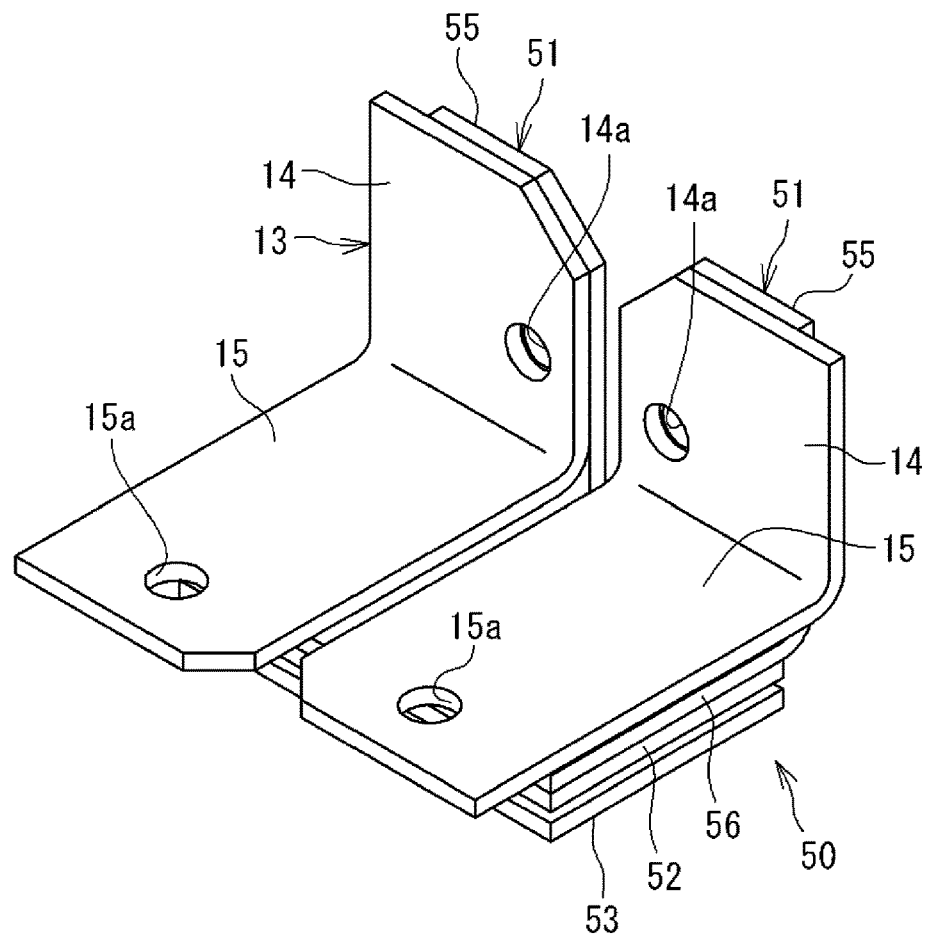
FIG. 9 is a perspective view showing components of busbars and a heat dissipation structure.
Figure 10:
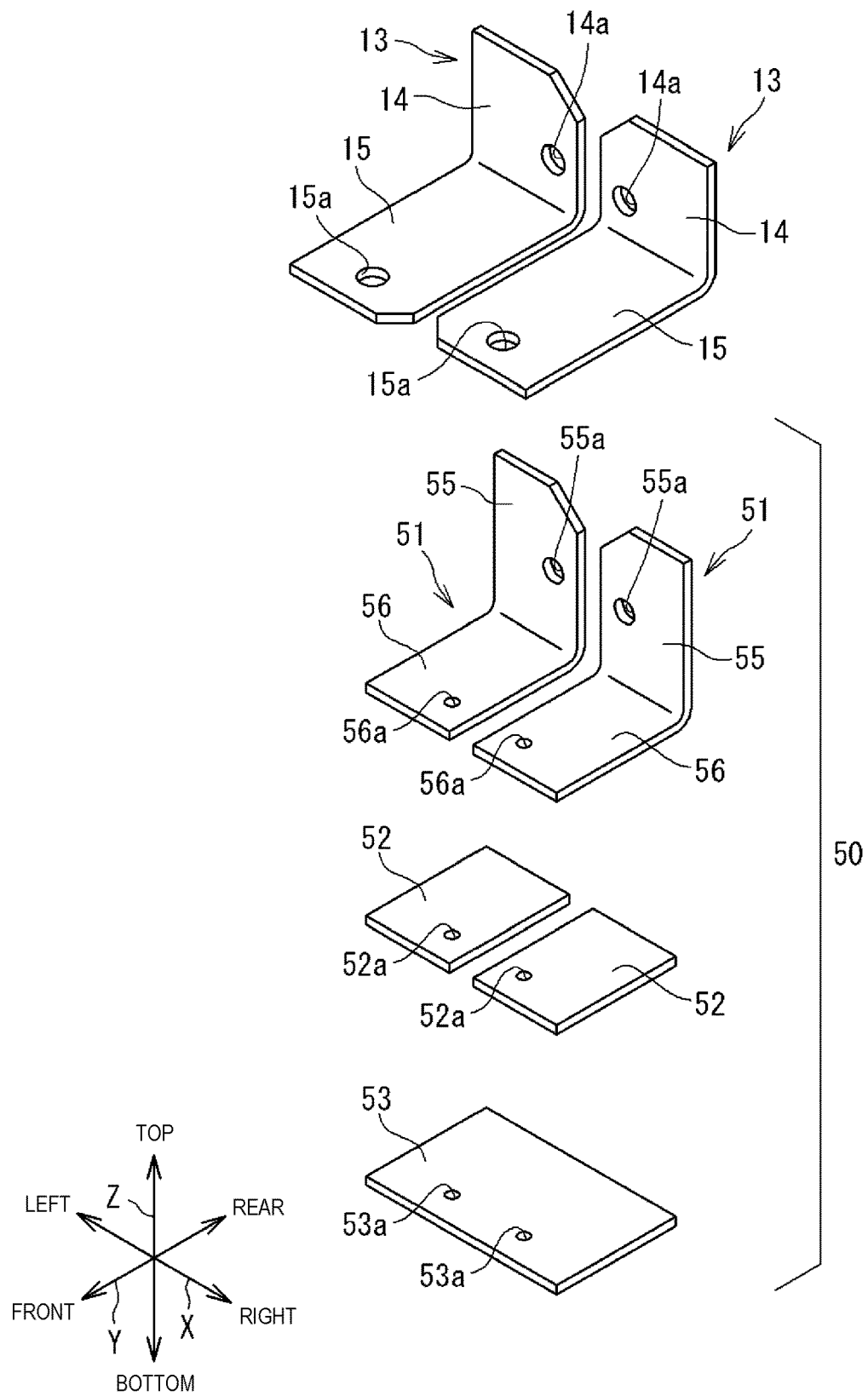
FIG. 10 is an exploded perspective view showing the components of the busbars and the heat dissipation structure.

FIG. 7 is a cross-sectional view taken along a line A-A in FIG. 2. FIG. 9 is a perspective view showing components of the busbars and the heat dissipation structure. FIG. 10 is an exploded perspective view showing the components of the busbars and the heat dissipation structure.

As shown in FIGS. 7 and 8, the heat dissipation structure 50 includes heat dissipation plates (first heat dissipation members) 51, upper heat dissipation sheets (second heat dissipation members) 52, and a lower heat dissipation sheet (third heat dissipation member) 53. As shown in FIG. 10, two heat dissipation plates 51 and two upper heat dissipation sheets 52 are provided in correspondence with the two busbars 13. One lower heat dissipation sheet 53 is provided in correspondence with the two heat dissipation plates 51 and the two upper heat dissipation sheets 52 arranged side-by-side in the left-right direction. As shown in FIGS. 7 and 8, lower portions of the heat dissipation plates 51 and the upper heat dissipation sheets 52 are provided in a housing space 27 formed between the upper case member 21 and the lower case member 22.

The heat dissipation plates 51 are made of metal. Specifically, the heat dissipation plates 51 are made of the same material as the busbars 13, such as copper, a copper alloy, aluminum, or an aluminum alloy, for example. The heat dissipation plates 51 are formed by bending a single strip into an L-shape. Each heat dissipation plate 51 includes a first piece 55 and a second piece 56 that are orthogonal to each other.

As shown in FIG. 8, the first pieces 55 of the heat dissipation plates 51 are attached to the terminals 12a of the relay 12 via the connection members 16. Specifically, each first piece 55 is provided with a connection hole 55a passing therethrough, into which a connection member 16 is inserted. The first pieces 55 of the heat dissipation plates 51 are overlaid on the first pieces 14 of the busbars 13. The first pieces 55 of the heat dissipation plates 51 are provided between the first pieces 14 of the busbars 13 and the relay 12. Heat generated in the relay 12 is transferred to both the heat dissipation plates 51 and the busbars 13 from the terminals 12a.

he lower ends of the first pieces 55 of the heat dissipation plates 51 pass through slits 26 formed in the top plate 21a of the upper case member 21, and are located within the case 11.

The second pieces 56 of the heat dissipation plates 51 are provided below the second pieces 15 of the busbars 13. The top plate 21a of the upper case member 21 is provided between the second pieces 56 of the heat dissipation plates 51 and the second pieces 15 of the busbars 13. Therefore, the second pieces 15 of the busbars 13, the top plate 21a of the upper case member 21, and the second pieces 56 of the heat dissipation plates 51 are stacked in this order from bottom to top. The second pieces 56 of the heat dissipation plates 51 constitute a first layer portion that is stacked on the top plate 21a of the upper case member 21. The second pieces 15 of the busbars 13 constitute a second layer portion that is stacked on the top plate 21a of the upper case member 21 and the first layer portion 56.

As shown in FIG. 7, the plurality of ridges 44 are formed on the lower surface of the top plate 21a of the upper case member 21, and the lower ends of the ridges 44 are in contact with the upper surfaces of the second pieces 56 of the heat dissipation plates 51.

As shown in FIGS. 7 and 8, the upper heat dissipation sheets 52 are stacked below the second pieces 56 of the heat dissipation plates 51. As shown in FIG. 10, the upper heat dissipation sheets 52 are sheet members formed in a rectangular shape in a plan view. The upper heat dissipation sheets 52 are made of a thermally conductive synthetic resin such as acrylic, another acrylic material, a silicon material, or the like. The upper heat dissipation sheets 52 are bonded to the lower surfaces of the second pieces 56 of the heat dissipation plates 51. The upper heat dissipation sheets 52 are placed on the sheet base 58 of the lower case member 22. Therefore, the upper heat dissipation sheets 52 are sandwiched between the second pieces 56 of the heat dissipation plates 51 and the sheet base 58 of the lower case member 22.

As described above, when the upper case member 21 and the lower case member 22 are coupled to each other via the first to fourth coupling portions 28 to 31, the second pieces (the first layer portion) 56 of the heat dissipation plates 51 and the upper heat dissipation sheets 52 are sandwiched and compressed between the upper case member 21 and the lower case member 22. Thus, the second pieces 56 of the heat dissipation plates 51 and the upper heat dissipation sheets 52 are brought into close contact with each other.

As shown in FIGS. 7 and 8, the lower heat dissipation sheet 53 is stacked below the sheet base 58 of the lower case member 22. Therefore, the lower heat dissipation sheet 53 is placed on the portion recessed downward of the lower surface of the bottom plate 22a of the lower case member 22. As shown in FIG. 10, the lower heat dissipation sheet 53 is a sheet member formed in a rectangular shape in a plan view. The lower heat dissipation sheet 53 is made of a thermally conductive synthetic resin such as acrylic, another acrylic material, a silicon material, or the like.

As shown in FIGS. 7 and 8, the lower surface of the lower heat dissipation sheet 53 is in contact with the upper surface of the attachment-target member 100 to which the electrical junction box 10 is attached. The boss portions 11a of the case 11 (see FIG. 1) are attached to the attachment-target member 100 using bolts or the like, and consequently the lower heat dissipation sheet 53 is compressed between the sheet base 58 of the lower case member 22 and the attachment-target member 100. Thus, the lower case member 22 and the lower heat dissipation sheet 53 are brought into close contact with each other, and the lower heat dissipation sheet 53 and the attachment-target member 100 are brought into close contact with each other.

The relay 12 generates heat due to a contact point being repeatedly opened and closed. Heat generated in the relay 12 is transferred to the heat dissipation plates 51 and the busbars 13 from the terminals 12a. The upper heat dissipation sheets 52, the lower case member 22, and the lower heat dissipation sheet 53 are stacked on the heat dissipation plates 51, and the heat dissipation plates 51 have a larger heat capacity than the busbars 13, and therefore the heat generated in the relay 12 is transferred to the heat dissipation plates 51 side rather than to the busbars 13. The heat transferred to the heat dissipation plates 51 is transferred to the attachment-target member 100 via the upper heat dissipation sheets 52, the lower case member 22 (the sheet base 58), and the lower heat dissipation sheet 53, and is dissipated from the attachment-target member 100 to the outside.

The upper case member 21 is placed between the second pieces 15 of the busbars 13 and the second pieces 56 of the heat dissipation plates 51, and the upper case member 21 separates the power supply path on the busbars 13 side on the upper side and the heat dissipation path on the heat dissipation plates 51 on the lower side from each other. Therefore, heat generated in the relay 12 can be efficiently transferred to the heat dissipation plates 51 side and dissipated.

The heat dissipation plates 51 and the upper heat dissipation sheets 52 are sandwiched by the upper case member 21 and the lower case member 22 from above and below so as to be in close contact. In particular, the upper heat dissipation sheets 52 are softer than the heat dissipation plates 51, and therefore the upper heat dissipation sheets 52 are compressed in the top-bottom direction Z and are strongly brought into close contact with the heat dissipation plates 51. Thus, heat is efficiently transferred between the heat dissipation plates 51 and the upper heat dissipation sheets 52.

The lower surface of the top plate 21a of the upper case member 21 is provided with the ridges 44, and these ridges 44 suppress bending deformation such as warpage of the top plate 21a. Therefore, the top plate 21a can uniformly press the heat dissipation plates 51 against the upper heat dissipation sheets 52, and the entire upper heat dissipation sheets 52 can be brought into close contact with the heat dissipation plates 51.

The ridges 44 of the top plate 21a extend in the front-rear direction Y, which is the direction in which the protruding portions 25 protrude. The leading ends (the front ends) of the protruding portions 25 are likely to be subjected to bending deformation in the top-bottom direction Z, but the ridges 44 extending in the front-rear direction Y can efficiently suppress bending deformation of the protruding portions 25.

The leading ends of the ridges 44 of the top plate 21a are in contact with the heat dissipation plates 51, and thus the contact surface of the top plate 21a with the heat dissipation plates 51 is reduced. Therefore, heat transfer from the heat dissipation plates 51 to the top plate 21a can be suppressed and heat dissipation from the heat dissipation plates 51 to the upper heat dissipation sheets 52 side can be facilitated.

The ridges 44 may be formed on the bottom plate 22a of the lower case member 22. If this is the case, the ridges 44 can suppress bending deformation such as warpage of the lower case member 22. In addition, ridges may be formed on both the upper case member 21 and the lower case member 22. The ridges 44 may extend in the left-right direction X.

The case 11 is provided with the first coupling portion 28 and the second coupling portions 29 that couple the upper case member 21 and the lower case member 22 to each other. The first coupling portion 28 and the second coupling portions 29 are provided at an interval in the front-rear direction Y, with the heat dissipation plates 51 and the upper heat dissipation sheets 52, which constitute the heat dissipation structure 50, being interposed therebetween. The first coupling portion 28 is provided at the outer periphery of the case 11 (the leading ends of the protruding portions 25), and the second coupling portions 29 are provided inside the outer periphery of the case 11. Due to such first coupling portion 28 and second coupling portions 29, the heat dissipation plates 51 and the upper heat dissipation sheets 52 can be sandwiched between the upper and lower case members 21 and 22 and reliably brought into close contact, and accordingly heat can be efficiently transferred therebetween.

In addition, at the left and right ends of the protruding portions 25, the case 11 is provided with the third coupling portion 30 and the fourth coupling portion 31 that couple the upper case member 21 and the lower case member 22 to each other. Therefore, the upper case member 21 and the lower case member 22 coupled to each other by the first to fourth coupling portions 28 to 31 that are located so as to surround the heat dissipation plates 51 and the upper heat dissipation sheets 52 from all sides. Thus, the heat dissipation plates 51 and the upper heat dissipation sheets 52 can be more reliably brought into close contact.

As shown in FIGS. 8 and 12, in the bottom plate 22a of the lower case member 22, the engagement-target portion 38 of each second coupling portion 29 is formed in the vicinity of the opening 41 passing through the bottom plate 22a in the top-bottom direction Z. In addition, as also shown in FIG. 4, the lower case member 22 is provided with a wall 43 that protrudes upward toward the upper case member 21 between the opening 41 and the heat dissipation plate 51. This wall 43 is located at the front edge of the opening 41. A gap t is formed between the upper end of each wall 43 and the top plate 21a of the upper case member 21.

In the present embodiment, the second coupling portions 29 are provided rearward of the heat dissipation plates 51, and the openings 41 into which the engagement portions 37 of the second coupling portions 29 are inserted are formed in the lower case member 22. Therefore, the heat dissipation plates 51 and the attachment-target member 100 are located close to each other with a space therebetween. The heat dissipation plates 51 are conductive members, to which a voltage is applied from the terminals 12a of the relay 12, and therefore a short-circuit to the attachment-target member 100 may occur through the space. In the present embodiment, the walls 43 are provided between the heat dissipation plates 51 and the attachment-target member 100, and therefore the insulation distance (creepage distance) between the heat dissipation plates 51 and the attachment-target member 100 can be extended, and the insulation between the heat dissipation plates 51 and the attachment-target member 100 can be improved.

Figure 11:
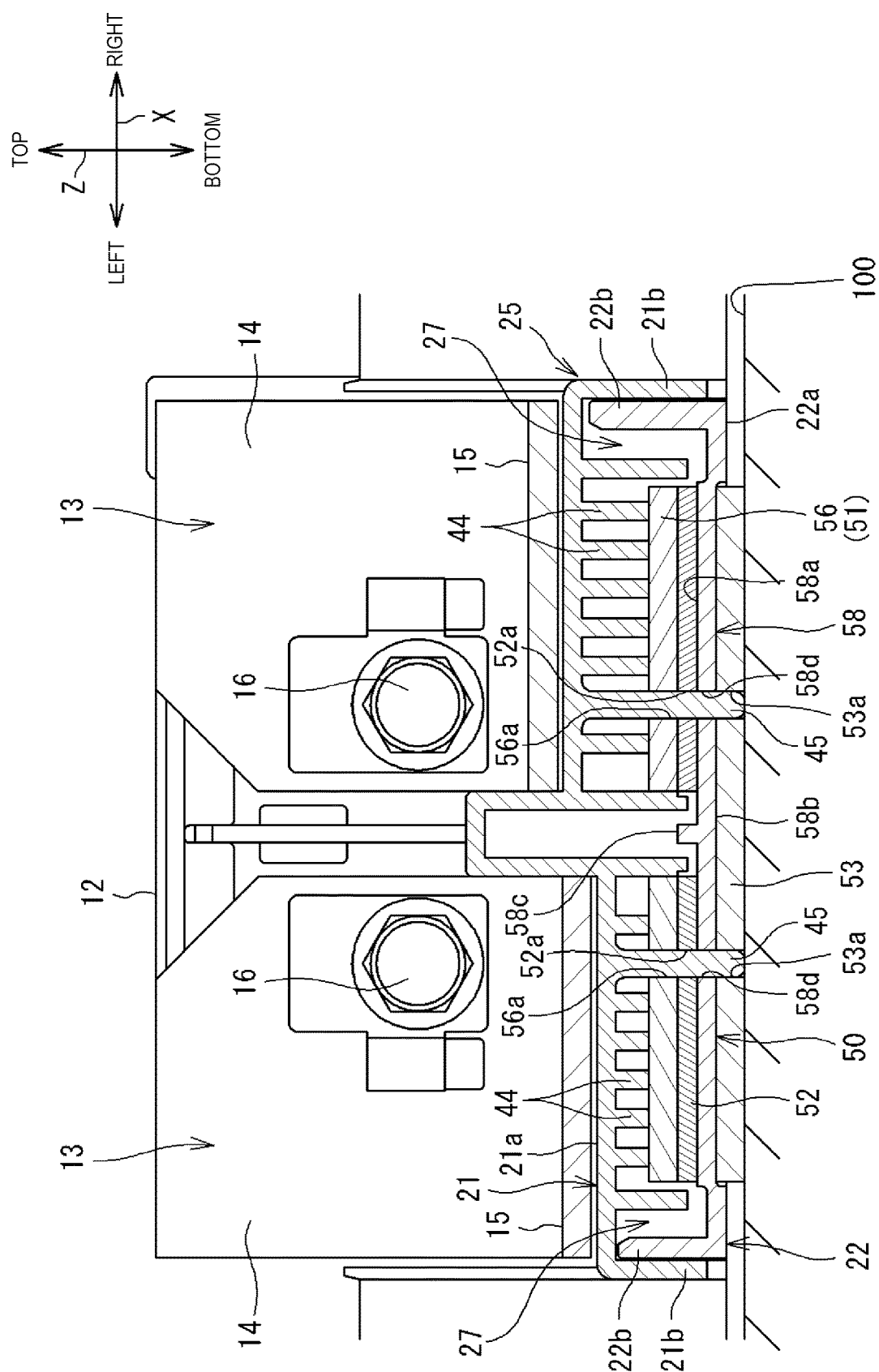
FIG. 11 is a cross-sectional view taken along a line C-C in FIG. 2.

FIG. 11 is a cross-sectional view taken along a line C-C in FIG. 2.

As shown in FIGS. 8 and 11, the positioning protrusions 45 provided on the top plate 21a of the upper case member 21 pass through the heat dissipation plates 51, the upper heat dissipation sheets 52, the lower case member 22, and the lower heat dissipation sheet 53 in the top-bottom direction Z. As also shown in FIG. 10, the second pieces 56 of the heat dissipation plates 51, the upper heat dissipation sheets 52, and the lower heat dissipation sheet 53 are provided with positioning holes 56a, 52a, and 53a that pass therethrough in the top-bottom direction Z. In addition, the bottom plate 22a of the lower case member 22 is provided with positioning holes 58d that pass therethrough in the top-bottom direction Z. The positioning protrusions 45 of the upper case member 21 are inserted into these positioning holes 56a, 52a, 53a, and 58d, and thus the relative positions of the upper case member 21, the heat dissipation plates 51, the upper heat dissipation sheets 52, the lower case member 22, and the lower heat dissipation sheet 53 are determined. As a result, these members are arranged at appropriate positions.

The lower ends 45a of the positioning protrusions 45 may only be inserted into the lower heat dissipation sheet 53 without passing therethrough. In addition, as indicated by imaginary lines in FIG. 8, the lower ends 45a of the positioning protrusions 45 may protrude downward from the lower heat dissipation sheet 53. If this is the case, the lower ends 45a of the positioning protrusions 45 are fitted into recesses (not shown) formed in the attachment-target member 100, and thus the position of the electrical junction box 10 relative to the attachment-target member 100 can also be determined using the positioning protrusions 45.

As shown in FIG. 10, the two heat dissipation plates 51 arranged side by side in the left-right direction have substantially the same outer shape. Therefore, when the heat dissipation plates 51 are to be attached to the case 11, they may be arranged on wrong sides. The two heat dissipation plates 51 according to the present embodiment are respectively provided with positioning holes 56a at different positions from each other. For example, the positioning hole 56a of the left heat dissipation plate 51 is provided in the right half thereof, and the positioning hole 56a of the right heat dissipation plate 51 is provided in the left half thereof. Therefore, even if an attempt is made to attach each of the left and right heat dissipation plates 51 to the wrong side, the positioning protrusions 45 of the upper case member 21 cannot be inserted into the positioning holes 56a. Therefore, it is possible to prevent incorrect attachment of the left and right heat dissipation plates 51.

The positioning protrusions 45 may be provided on the lower case member 22. If this is the case, positioning protrusions that protrude upward from the bottom plate 22a of the lower case member 22 and are to be inserted into the upper heat dissipation sheets 52, the heat dissipation plates 51, and the upper case member 21, and positioning protrusions that protrude downward from the bottom plate 22a and are to be inserted into the lower heat dissipation sheet 53, may be provided.

As shown in FIG. 8, the heat dissipation plates 51 are connected to the terminals 12a of the relay 12. Therefore, heat generated at the contact point in the relay 12 can be efficiently transferred from the terminals 12a to the heat dissipation plates 51.

In addition, as shown in FIG. 8, the heat dissipation plates 51 and the busbars 13 overlap each other at the positions of the terminals 12a of the relay 12. Therefore, a voltage can be applied from the terminals 12a to the busbars 13, and heat can be transferred from the terminals 12a to the heat dissipation plates 51.

SUPPLEMENTARY NOTES

At least some of the embodiments and various modifications described above may be combined with each other in any manner. It should be considered that the embodiments disclosed herein are illustrations and non-limiting in all respects. The scope of the present disclosure is indicated by the claims, and is intended to include all changes within the meaning and range of equivalents to the claims.

The invention claimed is:

1. An electrical junction box comprising:
   a case;
   a relay that is attached to the case;
   a first heat dissipation member that is connected to the relay so as to be able to transfer heat; and
   a second heat dissipation member that is connected to the first heat dissipation member so as to be able to transfer heat,
   wherein the case includes a first case member, a second case member, and a first coupling portion and a second coupling portion that couple the first case member and the second case member to each other,
   the first case member, the first heat dissipation member, the second heat dissipation member, and the second case member are stacked in this order in a predetermined first direction,
   the first coupling portion and the second coupling portion are arranged at an interval in a second direction that is orthogonal to the first direction, with the first heat dissipation member and the second heat dissipation member being interposed therebetween,
   the first coupling portion is provided on an outer peripheral portion of the case, and
   the second coupling portion is provided inward of the outer peripheral portion of the case.

2. The electrical junction box according to claim 1, wherein the first heat dissipation member is made of metal, and the second heat dissipation member is made of a synthetic resin.

3. The electrical junction box according to claim 2,
   wherein the case is provided with a protruding portion that protrudes in the second direction,
   the first heat dissipation member and the second heat dissipation member are provided on the protruding portion,
   the first coupling portion is provided at a leading end of the protruding portion in the second direction, and
   the second coupling portion is provided on the opposite side of the leading end of the protruding portion in the second direction with respect to the first heat dissipation member and the second heat dissipation member.

4. The electrical junction box according to claim 2,
   wherein the second coupling portion includes:
      an engagement portion that is provided on the first case member; and
      an engagement-target portion that is provided on the second case member and engages with the engagement portion in the first direction, and
   at least either one of the engagement portion and the engagement-target portion is provided with an inclined engagement surface that is configured to bring the other of the engagement portion and the engagement-target portion closer to the one of the engagement portion and the engagement-target portion in a direction orthogonal to the first direction when the first case member and the second case member, with the engagement portion and the engagement-target portion engaging with each other, are separated from each other.

5. The electrical junction box according to claim 2,
   wherein the second coupling portion includes:
      an engagement portion that is provided on the first case member; and
      an engagement-target portion that is provided on the second case member and with which the engagement portion engages,
   the second case member is provided with an opening that passes therethrough in the first direction at a position near the engagement-target portion, and
   the second case member is provided with a wall that is located between the opening and the first heat dissipation member and protrudes toward the first case member.

6. The electrical junction box according to claim 1,
   wherein the case is provided with a protruding portion that protrudes in the second direction,
   the first heat dissipation member and the second heat dissipation member are provided on the protruding portion,
   the first coupling portion is provided at a leading end of the protruding portion in the second direction, and
   the second coupling portion is provided on the opposite side of the leading end of the protruding portion in the second direction with respect to the first heat dissipation member and the second heat dissipation member.

7. The electrical junction box according to claim 6, wherein the case is further provided with a third coupling portion and a fourth coupling portion that couple the first case member and the second case member to each other, at two ends of the protruding portion in a third direction that is orthogonal to the first direction and the second direction.

8. The electrical junction box according to claim 7,
   wherein the second coupling portion includes:
      an engagement portion that is provided on the first case member; and
      an engagement-target portion that is provided on the second case member and engages with the engagement portion in the first direction, and
   at least either one of the engagement portion and the engagement-target portion is provided with an inclined engagement surface that is configured to bring the other of the engagement portion and the engagement-target portion closer to the one of the engagement portion and the engagement-target portion in a direction orthogonal to the first direction when the first case member and the second case member, with the engagement portion and the engagement-target portion engaging with each other, are separated from each other.

9. The electrical junction box according to claim 7,
   wherein the second coupling portion includes:
      an engagement portion that is provided on the first case member; and
      an engagement-target portion that is provided on the second case member and with which the engagement portion engages,
   the second case member is provided with an opening that passes therethrough in the first direction at a position near the engagement-target portion, and
   the second case member is provided with a wall that is located between the opening and the first heat dissipation member and protrudes toward the first case member.

10. The electrical junction box according to claim 6,
    wherein the second coupling portion includes:
       an engagement portion that is provided on the first case member; and an engagement-target portion that is provided on the second case member and engages with the engagement portion in the first direction, and at least either one of the engagement portion and the engagement-target portion is provided with an inclined engagement surface that is configured to bring the other of the engagement portion and the engagement-target portion closer to the one of the engagement portion and the engagement-target portion in a direction orthogonal to the first direction when the first case member and the second case member, with the engagement portion and the engagement-target portion engaging with each other, are separated from each other.

11. The electrical junction box according to claim 6, wherein the second coupling portion includes:

an engagement portion that is provided on the first case member; and an engagement-target portion that is provided on the second case member and with which the engagement portion engages, the second case member is provided with an opening that passes therethrough in the first direction at a position near the engagement-target portion, and the second case member is provided with a wall that is located between the opening and the first heat dissipation member and protrudes toward the first case member.

12. The electrical junction box according to claim 1, wherein the second coupling portion includes:

an engagement portion that is provided on the first case member; and an engagement-target portion that is provided on the second case member and engages with the engagement portion in the first direction, and at least either one of the engagement portion and the engagement-target portion is provided with an inclined engagement surface that is configured to bring the other of the engagement portion and the engagement-target portion closer to the one of the engagement portion and the engagement-target portion in a direction orthogonal to the first direction when the first case member and the second case member, with the engagement portion and the engagement-target portion engaging with each other, are separated from each other.

13. The electrical junction box according to claim 12, wherein the second coupling portion includes:

an engagement portion that is provided on the first case member; and an engagement-target portion that is provided on the second case member and with which the engagement portion engages, the second case member is provided with an opening that passes therethrough in the first direction at a position near the engagement-target portion, and the second case member is provided with a wall that is located between the opening and the first heat dissipation member and protrudes toward the first case member.

14. The electrical junction box according to claim 1, wherein the second coupling portion includes:

an engagement portion that is provided on the first case member; and an engagement-target portion that is provided on the second case member and with which the engagement portion engages, the second case member is provided with an opening that passes therethrough in the first direction at a position near the engagement-target portion, and the second case member is provided with a wall that is located between the opening and the first heat dissipation member and protrudes toward the first case member.

* * * * *